United States Patent
Hammes et al.

(10) Patent No.: US 7,127,221 B2
(45) Date of Patent: Oct. 24, 2006

(54) RECEIVER CIRCUIT, PARTICULARLY FOR MOBILE RADIO

(75) Inventors: Markus Hammes, Dinslaken (DE); Stefan Heinen, Baesweiler (DE); Stefan Van Waasen, Duisburg (DE); Andre Hanke, Düsseldorf (DE); Elmar Wagner, Duisburg (DE)

(73) Assignee: Infineon Technologies AG, Munich (DE)

( * ) Notice: Subject to any disclaimer, the term of this patent is extended or adjusted under 35 U.S.C. 154(b) by 628 days.

(21) Appl. No.: 10/384,999

(22) Filed: Mar. 10, 2003

(65) Prior Publication Data

US 2003/0156052 A1   Aug. 21, 2003

Related U.S. Application Data

(63) Continuation of application No. PCT/DE01/03426, filed on Sep. 6, 2001.

(30) Foreign Application Priority Data

Sep. 8, 2000  (DE) ................................ 100 44 456

(51) Int. Cl.
*H04B 17/02* (2006.01)
*H03M 3/00* (2006.01)

(52) U.S. Cl. ....................... 455/135; 455/337; 341/143

(58) Field of Classification Search ................ 455/135, 455/130, 205, 214, 334, 337; 375/242, 243, 375/245, 247, 334; 341/143, 155; 329/341
See application file for complete search history.

(56) References Cited

U.S. PATENT DOCUMENTS

| | | | |
|---|---|---|---|
| 4,521,892 A * | 6/1985 | Vance et al. ................. | 375/334 |
| 4,857,928 A * | 8/1989 | Gailus et al. ................ | 341/143 |
| 5,436,931 A * | 7/1995 | Minami ....................... | 375/334 |
| 5,448,202 A * | 9/1995 | Owen .......................... | 455/337 |
| 5,715,529 A | 2/1998 | Kianush et al. | |
| 5,734,683 A | 3/1998 | Hulkko et al. | |
| 5,757,867 A | 5/1998 | Caulfield et al. | |
| 5,764,171 A | 6/1998 | Stikvoort | |
| 5,828,955 A | 10/1998 | Lipowski et al. | |
| 6,005,506 A | 12/1999 | Bazarjani et al. | |
| 6,498,819 B1 * | 12/2002 | Martin ......................... | 341/143 |
| 6,515,609 B1 * | 2/2003 | Moulsley ..................... | 341/155 |

(Continued)

FOREIGN PATENT DOCUMENTS

DE    40 06 654 A1    9/1991

(Continued)

OTHER PUBLICATIONS

Wu Chou et al.: "Modulo Sigma-Delta Modulation", *IEEE Transactions on Communications*, vol. 40, No. 8, Aug. 1992, pp. 1388-1395.

(Continued)

*Primary Examiner*—Aung Moe
(74) *Attorney, Agent, or Firm*—Laurence A. Greenberg; Werner H. Stemer; Ralph E. Locher

(57) ABSTRACT

In a receiver circuit for demodulating a high-frequency signal, a limiting amplifier stage with a downstream sigma-delta converter is connected in series with a mixer stage that transforms a high-frequency signal that is supplied at its input into an intermediate-frequency signal. The intermediate-frequency signal at the output of the limiting amplifier stage is value-discrete and time-continuous. The described receiver architecture has a high sensitivity, is substantially independent of production tolerances, and occupies a small area; therefore, it is particularly suitable for mobile radio applications.

8 Claims, 1 Drawing Sheet

U.S. PATENT DOCUMENTS

| | | | |
|---|---|---|---|
| 6,584,157 B1 * | 6/2003 | Van Der Zwan et al. | ... 341/143 |
| 6,590,943 B1 * | 7/2003 | Ali | ............................ 455/130 |
| 2004/0166803 A1 * | 8/2004 | Moloudi et al. | .............. 455/20 |

FOREIGN PATENT DOCUMENTS

| | | | |
|---|---|---|---|
| EP | 0398 981 B1 | | 11/1990 |
| EP | 0 619 656 B1 | | 10/1994 |
| EP | 0 769 222 B1 | | 4/1997 |
| JP | 6-77853 | | 3/1994 |
| JP | 06296167 A | * | 10/1994 |
| JP | 2000232362 A | * | 8/2000 |
| WO | WO 00/22735 | | 4/2000 |

OTHER PUBLICATIONS

Stephen A. Jantzi et al.: "Quadrature Bandpass ΔΣ Modulation for Digital Radio", *IEEE Journal of Solid-State Circuits*, vol. 32, No. 12, Dec, 1997, pp. 1935-1950.

Ian Galton et al. : "A Delta-Sigma PLL for 14-b, 50 kSample/s Frequency-to-Digital Conversion of a 10 MHz FM Signal", *IEEE Journal of Solid-State Circuits*, vol. 33, No. 12, Dec. 1998, pp. 2042-2053.

I. Galton et al.: "A ΔΣPLL for 14b 50kSample/s Frequency-to-Digital Conversion of a 10MHz FM Signal", *1998 IEEE International Solid-State Circuits Conference,Feb. 5-7, 1998, Digest of Technical Papers*, pp. 366-367.

Steven R. Norsworthy et al. (ed.): "Delta-Sigma Data Converters Theory Design, and Simulation", IEEE Press, Piscataway, NJ, pp. 4-9, and 282-289.

\* cited by examiner

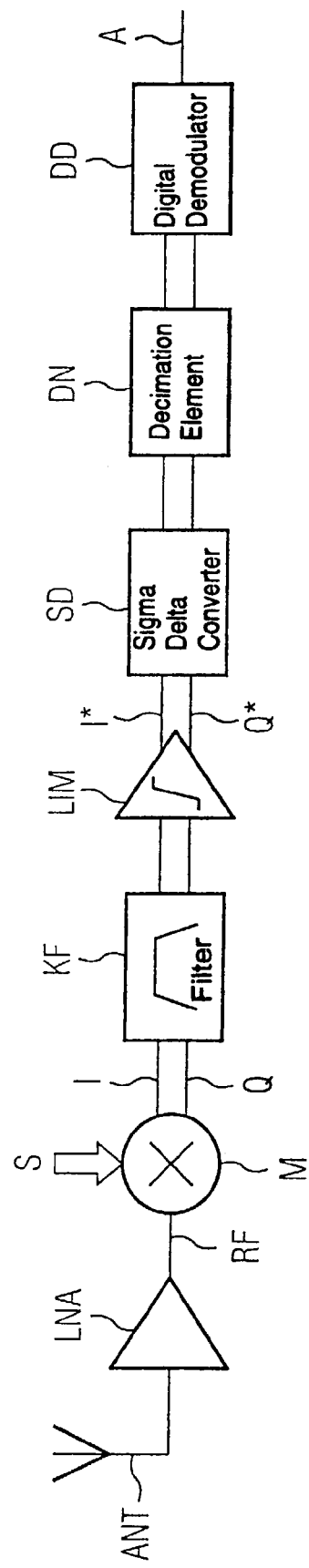

RECEIVER CIRCUIT, PARTICULARLY FOR MOBILE RADIO

CROSS-REFERENCE TO RELATED APPLICATION

This application is a continuation of copending International Application No. PCT/DE01/03426, filed Sep. 6, 2001, which designated the United States and was not published in English.

BACKGROUND OF THE INVENTION

Field of the Invention

The invention relates to a receiver circuit for demodulating a high-frequency signal, particularly for a mobile radio.

Superheterodyne reception architectures are normally employed in mobile radio applications and cordless telephones for receiving high-frequency modulated signals. These architectures have a relatively high intermediate-frequency level. The disadvantage of the superheterodyne architecture is its large consumption of space and the relatively poor integration possibilities.

In order to improve the monolithic integration of mobile radio receivers, there is a trend toward radio receivers with a low intermediate frequency or an intermediate frequency of zero.

Such radio receivers with a low intermediate frequency can have an analog construction. But analog components that are integrated are typically associated with significant tolerances, and therefore a required receiver sensitivity can only be achieved at great expense, if at all.

Other known receiver architectures employ analog/digital converters on the intermediate-frequency level following the receiver front-end in order to make it possible to digitally process the reception signals. The analog/digital converters must satisfy high requirements with respect to resolution and precision and therefore occupy a large chip area and have a significant power consumption. These disadvantages conflict with the demand in mobile radio technology generally for ever smaller dimensions, lighter weight, and longer battery lifetime of the mobile radio devices.

The document titled "A Delta-Sigma PLL for 14-b, 50 kSample/s Frequency-to-Digital Conversion of a 10 MHz FM signal" (Ian Galton, *IEEE JSEC*, Vol. 33, December 1998, pp. 2042–2053) describes a radio receiver in which a filter with a downstream limiter, a $\Delta\Sigma$ converter, and a decimation filter is provided on an intermediate-frequency level. This configuration replaces the analog quadrature backward conversion, which is considered expensive, with an AD converter in the in-phase and quadrature branches, respectively.

SUMMARY OF THE INVENTION

It is accordingly an object of the invention to provide a receiver circuit, particularly for a mobile radio that overcomes the above-mentioned disadvantages of the prior art devices of this general type, which has high sensitivity, low noise, and consumes a small chip area.

With the foregoing and other objects in view there is provided, in accordance with the invention, a receiver circuit. The receiver circuit contains a mixer stage having an input for receiving a high-frequency signal to be demodulated, and an output outputting a complex-value intermediate-frequency signal derived from the high-frequency signal.

A limiting amplifier stage is disposed downstream of the mixer stage. The limiting amplifier stage receives the complex-value intermediate-frequency signal and has an output outputting a value-discrete, complex-value signal derived from the complex-value intermediate-frequency signal. A sigma-delta converter is connected to the output of the limiting amplifier stage. A polyphase filter for channel selection is disposed between the mixer stage and the limiting amplifier stage.

At the output of the limiting amplifier that is provided on the intermediate-frequency level, the intermediate-frequency signal that is derived from the high-frequency signal is made available as a value-discrete and time-continuous signal. The limiting amplifier assigns logic states, for instance 0 (low) or 1 (high), to the signal. The intermediate-frequency signal can be dismantled into its quadrature components. Connected to the output of the limiting amplifier stage is a sigma-delta converter, at whose output a digital time-discrete and value-discrete signal is present, which can be digitally demodulated.

The sigma-delta converter can contain an oversampling of the value-discrete signal that is derived from the intermediate-frequency signal.

The present receiver circuit has a high sensitivity and low noise and occupies a small chip area.

According to the inventive principle, a channel filter for channel selection is provided between the mixer stage and the limiting amplifier stage. The channel filter can serve for suppressing unwanted frequencies. Because the intermediate-frequency signal is present as a complex signal that is dismantled into in-phase and quadrature components, the channel filter is expediently constructed as a complex filter, namely a polyphase filter.

In an advantageous development of the present invention, a digital demodulator is provided, which is connected to an output of the sigma-delta converter. There being digital time-discrete and value-discrete signals already present at the output of the sigma-delta converter, an immediate digital demodulation can be achieved easily and with little outlay.

In another embodiment of the invention, a decimation element is provided on the output side of the sigma-delta converter. The decimation element can reduce the clock rate of the signal that is derivable on the output side of the sigma-delta converter, which makes it possible to process the signal, for instance by demodulation, with little outlay. Furthermore, the high clock rate that is conditioned by the over-sampling of the sigma-delta converter can be reduced.

In another advantageous embodiment of the present invention, the sigma-delta converter is a time-continuous bandpass sigma-delta modulator. On the basis of the bandpass characteristics of the sigma-delta converter, higher harmonics of the intermediate-frequency signal are filtered out.

In another advantageous embodiment of the present invention, a polyphase filter is provided in the sigma-delta converter. It is thus possible to filter out unwanted signal portions in the complex frequency spectrum.

The receiver circuit can be configured for low intermediate frequencies (low IF). For instance, the intermediate-frequency signal frequencies can be less than or equal to 20 MHz.

For purposes of supplying the high-frequency signal, the mixer stage can be connected to an antenna with its first input.

A complex carrier signal can be supplied at a second input of the mixer stage. The frequency of the complex carrier signal, which is dismantled into I and Q components, can be matched in such a way that an intermediate-frequency signal with a fixed carrier frequency is continuously present at the output of the mixer stage.

Other features which are considered as characteristic for the invention are set forth in the appended claims.

Although the invention is illustrated and described herein as embodied in a receiver circuit, particularly for a mobile radio, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWING

The single FIGURE of the drawing is a block diagram of an embodiment of a receiver circuit according to the invention.

DESCRIPTION OF THE PREFERRED EMBODIMENTS

Referring now to the single FIGURE of the drawing in detail, there is shown a mixer stage M, at whose first input a high-frequency signal RF that is to be demodulated is supplied, and at whose second input a complex carrier signal S is supplied. The mixer stage M can include two analog mixers, one of which is supplied with an unmodified carrier signal, and the other of which is supplied with a carrier signal phase-shifted 90°. An antenna ANT with a downstream low-noise preamplifier LNA is connected to the first input of the mixer stage M.

At an output of the mixer stage M, on the intermediate-frequency level, is an intermediate-frequency signal I, Q with an in-phase component I and a quadrature component Q, which signal is derived from the high-frequency signal RF. For filtering unwanted signals, a channel filter KF, which is constructed as a polyphase filter, is connected to the mixer stage M on load side. Connected on an output side of the channel filter KF is a limiting amplifier stage LIM, to which the complex intermediate-frequency signal I, Q is supplied, and at whose output a value-discrete signal I*, Q* which is derived from the intermediate-frequency signal is available. The value-discrete signal can have the status 0 (low) or high (1). The signal that is derivable on the output side of the limiting amplifier LIM is a time-continuous signal.

Connected to the output of the limiting amplifier LIM is a sigma-delta modulator SD, which is constructed as a time-continuous sigma-delta bandpass converter SD. The function of the sigma-delta converter SD is, on one hand, to convert the value-discrete, time-continuous signal at its input into a value-discrete and time-discrete signal, and on the other hand, to filter out the unwanted higher harmonic of the value-discrete signal I*, Q* by an integrated bandpass function.

Owing to the over-sampling of the sigma-delta converter SD, the quantization noise is appreciably reduced.

Connected on the output side of the sigma-delta converter SD are a decimation element DN and a digital demodulator DD, at whose output a demodulated digital signal A is available.

The decimation element DN serves for reducing the clock rate of the digital signal that is derivable at the output of the sigma-delta converter SD, whose clock rate is high owing to the over-sampling.

The intermediate-frequency level of the present receiver configuration is configured for low intermediate frequencies (low IF). For simpler digital processing, the complex digital output signal of the sigma-delta converter can be mixed down to the carrier frequency of zero by a complex mixer.

The receiver circuit described in connection with the FIGURE is highly precise, occupies a small area, and has low power consumption. In addition, it is substantially independent of the production-related tolerances normally associated with analog components.

We claim:

1. A receiver circuit, comprising: a mixer stage having an input for receiving a high-frequency signal to be demodulated, and an output outputting a complex-value intermediate frequency signal derived from the high-frequency signal;
    a limiting amplifier stage disposed downstream of said mixer stage, said limiting amplifier stage receiving the complex-value intermediate-frequency signal and having an output outputting a value-discrete, complex-value signal derived from the complex-value intermediate-frequency signal;
    a sigma-delta converter directly connected to said output of said limiting amplifier stage for converting the value-discrete, complex-value signal outputted by said limiting amplifier stage into a value-discrete and time discrete signal; and
    a polyphase filter for channel selection disposed between said mixer stage and said limiting amplifier stage.

2. The receiver circuit according to claim 1, further comprising a digital demodulator, and said sigma-delta converter having an output coupled to said digital demodulator.

3. The receiver circuit according to claim 1, further comprising a decimation element disposed downstream of said sigma-delta converter.

4. The receiver circuit according to claim 1, wherein said sigma-delta converter is a time-continuous bandpass sigma-delta modulator.

5. The receiver circuit according to claim 1, wherein said sigma-delta converter has a further polyphase filter for filtering a complex frequency spectrum.

6. The receiver circuit according to claim 1, wherein a frequency level of the complex-value intermediate-frequency signal is less than or equal to 20 MHz.

7. The receiver circuit according to claim 1, further comprising an antenna connected to said input of said mixer stage.

8. The receiver circuit according to claim 1, wherein said mixer stage has a further input for receiving a complex carrier signal.

* * * * *